United States Patent
Ranjan et al.

(10) Patent No.: US 7,354,630 B2
(45) Date of Patent: Apr. 8, 2008

(54) USE OF OXYGEN-CONTAINING GASES IN FABRICATION OF GRANULAR PERPENDICULAR MAGNETIC RECORDING MEDIA

(75) Inventors: Rajiv Ranjan, San Jose, CA (US); Thomas Patrick Nolan, Fremont, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 370 days.

(21) Appl. No.: 10/701,418

(22) Filed: Nov. 6, 2003

(65) Prior Publication Data
US 2005/0100764 A1 May 12, 2005

(51) Int. Cl.
*H05H 1/00* (2006.01)
(52) U.S. Cl. .................. 427/535; 427/458; 427/533; 428/826
(58) Field of Classification Search ............. 427/535, 427/458, 533
See application file for complete search history.

(56) References Cited

U.S. PATENT DOCUMENTS

| | | | |
|---|---|---|---|
| 5,019,210 A * | 5/1991 | Chou et al. ............... | 427/307 |
| 5,679,473 A | 10/1997 | Murayama et al. | |
| 6,468,670 B1 | 10/2002 | Ikeda et al. | |
| 7,081,268 B2 * | 7/2006 | Chang et al. ............... | 427/128 |
| 2002/0028355 A1 | 3/2002 | Nakamura et al. | |
| 2002/0037439 A1 | 3/2002 | Litvinov et al. | |
| 2002/0160232 A1 | 10/2002 | Shimizu et al. | |
| 2003/0064253 A1 | 4/2003 | Uwazumi et al. | |
| 2003/0157375 A1 | 8/2003 | Uwazumi et al. | |
| 2006/0048893 A1 * | 3/2006 | Selwyn et al. ......... | 156/345.43 |

* cited by examiner

*Primary Examiner*—Alain L. Bashore
(74) *Attorney, Agent, or Firm*—McDermott Will & Emery LLP

(57) ABSTRACT

A granular perpendicular magnetic recording medium, comprising:
(a) a non-magnetic substrate having a surface; and
(b) a layer stack on the substrate surface, the layer stack including a granular perpendicular magnetic recording layer formed by:
(1) reactively sputtering a target comprised of a magnetic alloy in an atmosphere containing at least one ionized oxygen species derived from a source gas comprised of a compound of oxygen and at least one other non-metallic element; and
(2) oxidizing an exposed upper surface of the granular perpendicular magnetic recording layer by generating a plasma containing at least one ionized oxygen species derived from a source gas comprised of a compound of oxygen and at least one other non-metallic element and treating the exposed upper surface of the granular perpendicular magnetic recording layer with the plasma.

19 Claims, 2 Drawing Sheets

USE OF OXYGEN-CONTAINING GASES IN FABRICATION OF GRANULAR PERPENDICULAR MAGNETIC RECORDING MEDIA

CROSS-REFERENCE TO RELATED APPLICATIONS

This application contains subject matter related to subject matter disclosed in co-pending, commonly assigned U.S. patent applications Ser. No. 10/663,698, filed on Sep. 17, 2003; Ser. No. 10/704,746, filed on Nov. 12, 2003; and Ser. No. 10/704,593, filed on Nov. 12, 2003.

FIELD OF THE INVENTION

The present invention relates to improved methods for enhancing the performance characteristics of high areal recording density magnetic recording media, and to high areal recording density magnetic recording media obtained thereby. The invention has particular utility in the manufacture of high areal recording density perpendicular media, e.g., hard disks, utilizing granular-type magnetic recording layers.

BACKGROUND OF THE INVENTION

Magnetic media are widely used in various applications, particularly in the computer industry, and efforts are continually made with the aim of increasing the areal recording density, i.e., bit density of the magnetic media. In this regard, so-called "perpendicular" recording media have been found to be superior to the more conventional "longitudinal" media in achieving very high bit densities. In perpendicular magnetic recording media, residual magnetization is formed in a direction perpendicular to the surface of the magnetic medium, typically a layer of a magnetic material on a suitable substrate. Very high linear recording densities are obtainable by utilizing a "single-pole" magnetic transducer or "head" with such perpendicular magnetic media.

Efficient, high bit density recording utilizing a perpendicular magnetic medium requires interposition of a relatively thick (as compared with the magnetic recording layer), magnetically "soft" underlayer ("SUL") layer, i.e., a magnetic layer having a relatively low coercivity below about 1 kOe, such as of a NiFe alloy (Permalloy), between the non-magnetic substrate, e.g., of glass, aluminum (Al) or an Al-based alloy, and the magnetically "hard" recording layer having relatively high coercivity, typically about 3-8 kOe, e.g., of a cobalt-based alloy (e.g., a Co—Cr alloy such as CoCrPtB) having perpendicular anisotropy. The magnetically soft underlayer serves to guide magnetic flux emanating from the head through the hard, perpendicular magnetic recording layer.

A typical conventional perpendicular recording system 10 utilizing a vertically oriented magnetic medium 1 with a relatively thick soft magnetic underlayer, a relatively thin hard magnetic recording layer, and a single-pole head, is illustrated in FIG. 1, wherein reference numerals 2, 2A, 3, 4, and 5, respectively, indicate a non-magnetic substrate, an adhesion layer (optional), a soft magnetic underlayer, at least one non-magnetic interlayer, and at least one perpendicular hard magnetic recording layer. Reference numerals 7 and 8, respectively, indicate the single and auxiliary poles of a single-pole magnetic transducer head 6. The relatively thin interlayer 4 (also referred to as an "intermediate" layer), comprised of one or more layers of non-magnetic materials, serves to (1) prevent magnetic interaction between the soft underlayer 3 and the at least one hard recording layer 5 and (2) promote desired microstructural and magnetic properties of the at least one hard recording layer.

As shown by the arrows in the figure indicating the path of the magnetic flux φ, flux φ is seen as emanating from single pole 7 of single-pole magnetic transducer head 6, entering and passing through the at least one vertically oriented, hard magnetic recording layer 5 in the region below single pole 7, entering and traveling within soft magnetic underlayer 3 for a distance, and then exiting therefrom and passing through the at least one perpendicular hard magnetic recording layer 5 in the region below auxiliary pole 8 of single-pole magnetic transducer head 6. The direction of movement of perpendicular magnetic medium 1 past transducer head 6 is indicated in the figure by the arrow above medium 1.

With continued reference to FIG. 1, vertical lines 9 indicate grain boundaries of polycrystalline layers 4 and 5 of the layer stack constituting medium 1. Magnetically hard main recording layer 5 is formed on interlayer 4, and while the grains of each polycrystalline layer may be of differing widths (as measured in a horizontal direction) represented by a grain size distribution, they are generally in vertical registry (i.e., vertically "correlated" or aligned).

Completing the layer stack is a protective overcoat layer 11, such as of a diamond-like carbon (DLC), formed over hard magnetic layer 5, and a lubricant topcoat layer 12, such as of a perfluoropolyethylene material, formed over the protective overcoat layer.

Substrate 2 is typically disk-shaped and comprised of a non-magnetic metal or alloy, e.g., Al or an Al-based alloy, such as Al—Mg having an Ni—P plating layer on the deposition surface thereof, or substrate 2 is comprised of a suitable glass, ceramic, glass-ceramic, polymeric material, or a composite or laminate of these materials. Optional adhesion layer 2A, if present, may comprise an up to about 30 Å thick layer of a material such as Ti or a Ti alloy. Soft magnetic underlayer 3 is typically comprised of an about 500 to about 4,000 Å thick layer of a soft magnetic material selected from the group consisting of Ni, NiFe (Permalloy), Co, CoZr, CoZrCr, CoZrNb, CoFeZrNb, CoFe, Fe, FeN, FeSiAl, FeSiAlN, FeCoB, FeCoC, etc. Interlayer 4 typically comprises an up to about 300 Å thick layer or layers of non-magnetic material(s), such as Ru, TiCr, Ru/CoCr$_{37}$Pt$_6$, RuCr/CoCrPt, etc.; and the at least one hard magnetic layer 5 is typically comprised of an about 100 to about 250 Å thick layer(s) of Co-based alloy(s) including one or more elements selected from the group consisting of Cr, Fe, Ta, Ni, Mo, Pt, V, Nb, Ge, B, and Pd, iron nitrides or oxides, or a (CoX/Pd or Pt)$_n$ multilayer magnetic superlattice structure, where n is an integer from about 10 to about 25. Each of the alternating, thin layers of Co-based magnetic alloy of the superlattice is from about 2 to about 3.5 Å thick, X is an element selected from the group consisting of Cr, Ta, B, Mo, Pt, W, and Fe, and each of the alternating thin, non-magnetic layers of Pd or Pt is up to about 10 Å thick. Each type of hard magnetic recording layer material has perpendicular anisotropy arising from magneto-crystalline anisotropy ($1^{st}$ type) and/or interfacial anisotropy ($2^{nd}$ type).

Another currently employed way of classifying perpendicular magnetic recording media is on the basis by which the magnetic grains are mutually separated, i.e., segregated, in order to physically and magnetically de-couple the grains and provide improved media performance characteristics. According to this classification scheme, magnetic media with Co-based alloy perpendicular magnetic recording layers (e.g., CoCr alloys) are classified into two distinct types: (1) a first type, wherein segregation of the grains occurs by diffusion of Cr atoms of the magnetic layer to the grain boundaries of the layer to form Cr-rich grain boundaries, which diffusion process requires heating of the media substrate during formation (deposition) of the magnetic layer; and (2) a second type, wherein segregation of the grains occurs by formation of oxides and/or nitrides at the boundaries between adjacent magnetic grains to form so-called "granular" media, which oxides and/or nitrides may be formed by introducing a minor amount of at least one reactive gas, i.e., oxygen ($O_2$) and/or nitrogen ($N_2$) to the inert gas (e.g., Ar) atmosphere during sputter deposition of the Co alloy-based perpendicular magnetic layer.

"Granular" perpendicular magnetic recording media may be fabricated by a method wherein the media precursor, i.e., a media substrate with a stack of layers formed thereon, including a just-formed, i.e., topmost, granular perpendicular magnetic recording layer, is removed from the manufacturing apparatus, typically a multi-chamber sputtering apparatus adapted for performing large-scale, automated, continuous manufacture of magnetic recording media, for exposure to the ambient, i.e., $O_2$-containing, atmosphere in order to form a surface oxide layer on the magnetic recording layer prior to deposition of a protective overcoat layer thereon, e.g., a carbon (C)-based layer, such as diamond-like carbon (DLC).

Co-pending, commonly assigned U.S. patent application Ser. No. 10/663,698, filed on Sep. 17, 2003, discloses a method for performing surface oxidation of media precursors in a continuous manner by utilizing a manufacturing apparatus comprising a dedicated oxidation treatment chamber or station positioned between the consecutively arranged chambers or stations for sequential deposition of the magnetic recording layer and the protective overcoat layer. According to the invention disclosed therein, the dedicated oxidation chamber or station is supplied with oxygen ($O_2$) gas admixed with an inert carrier gas, at a sub-atmospheric pressure and at ambient (i.e., room) temperature, such that oxidation of the surface of the magnetic recording layer occurs during the interval in which the media precursor transits the chamber at a transport rate consistent with the transport rate through the other processing chambers or stations of the manufacturing apparatus.

Co-pending, commonly assigned U.S. patent application Ser. No. 10/704,746, filed on Nov. 12, 2003, discloses another method for performing surface oxidation of media precursors in a continuous manner, utilizing a manufacturing apparatus comprising a dedicated treatment chamber or station for performing thermally-assisted oxidation of the surface of the magnetic recording layer, positioned between the consecutively arranged chambers or stations for sequential deposition of the magnetic recording layer and the protective overcoat layer. According to the invention disclosed therein, the dedicated thermally-assisted oxidation chamber or station is supplied with oxygen ($O_2$) gas and includes heating means for maintaining the media precursors at an elevated temperature during treatment therein, such that oxidation of the surface of the magnetic recording layer is facilitated during the treatment interval in which the media precursor transits the chamber at a transport rate consistent with the transport rate through the other processing chambers or stations of the manufacturing apparatus.

Co-pending, commonly assigned U.S. patent application Ser. No. 10/704,593, filed on Nov. 12, 2003, discloses yet another method for performing surface oxidation of media precursors in a continuous manner, utilizing a manufacturing apparatus comprising a dedicated treatment chamber or station for performing plasma-assisted oxidation of the surface of the magnetic recording layer, positioned between the consecutively arranged chambers or stations for sequential deposition of the magnetic recording layer and the protective overcoat layer. According to the invention disclosed therein, the dedicated plasma-assisted oxidation chamber or station is supplied with oxygen ($O_2$) gas and includes means for creating a plasma comprising ionized oxygen species, whereby oxidation of the surface of the magnetic recording layer is facilitated during the treatment interval in which the media precursor transits the chamber at a transport rate consistent with the transport rate through the other processing chambers or stations of the manufacturing apparatus.

However, each of the above-described methods for forming "granular" perpendicular magnetic recording layers by reactive sputtering in an atmosphere containing $O_2$ gas and for performing post-deposition oxidation treatment of such layers in the ambient, i.e., $O_2$-containing, atmosphere or in dedicated oxidation chambers or stations supplied with $O_2$ gas, incurs one or more disadvantages and drawbacks, e.g., difficulty in controlling the amount of oxide surrounding each of the magnetic grains of the recording layer, and in obtaining satisfactorily uniform product. In addition, the highly reactive nature of $O_2$ gas requires that each treatment chamber or station of the multi-chamber manufacturing apparatus be very completely isolated from other treatment chambers or stations in order to prevent contamination of those treatment chambers or stations from which oxygen must be excluded, which complete isolation is extremely difficult to achieve with conventional manufacturing apparatus.

In view of the foregoing, there exists a clear need for methodologies for manufacturing improved, high areal recording density, high performance granular-type perpendicular magnetic recording media, which methodologies avoid the disadvantages and drawbacks associated with the above-described means and methodology, and which facilitate high throughput, cost-effective, automated manufacture of such high performance magnetic recording media.

The present invention, therefore, addresses and solves the above-described problems, drawbacks, and disadvantages associated with the above-described means and methodology for the manufacture of high performance magnetic recording media comprising granular-type perpendicular recording layers, while maintaining full compatibility with all aspects of automated manufacture of magnetic recording media.

DISCLOSURE OF THE INVENTION

An advantage of the present invention is improved methods of manufacturing a granular perpendicular magnetic recording medium.

Another advantage of the present invention is improved granular perpendicular magnetic recording media.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are obtained in part by a method of manufacturing granular perpendicular magnetic recording media, comprising sequential steps of:

(a) providing a non-magnetic substrate including a surface;

(b) forming a layer stack on the surface of the substrate, the layer stack including a granular perpendicular magnetic recording layer having an exposed upper surface;

(c) generating a plasma containing at least one ionized oxygen species derived from a source gas comprised of a compound of oxygen and at least one other non-metallic element; and (d) treating the exposed upper surface of the granular perpendicular magnetic recording layer with the plasma to form an oxidized surface layer.

According to embodiments of the present invention, step (a) comprises providing a non-magnetic substrate comprised of a non-magnetic material selected from the group consisting of: Al, NiP-plated Al, Al—Mg alloys, other Al-based alloys, other non-magnetic metals, other non-magnetic alloys, glass, ceramics, polymers, glass-ceramics, and composites and/or laminates of the aforementioned materials; and step (b) comprises forming a layer stack including a granular Co-based alloy perpendicular magnetic recording layer comprised of a CoPtX alloy, where X=at least one element or material selected from the group consisting of: Cr, Ta, B, Mo, V, Nb, W, Zr, Re, Ru, Cu, Ag, Hf, Ir, Y, O, Si, Ti, N, P, Ni, $SiO_2$, SiO, $Si_3N_4$, $Al_2O_3$, AlN, TiO, $TiO_2$, $TiO_x$, TiN, TiC, $Ta_2O_5$, NiO, and CoO, and wherein Co-containing magnetic grains with hcp lattice structure are segregated by grain boundaries comprising at least one of oxides, nitrides, and carbides.

Preferred embodiments of the present invention include those wherein step (b) comprises forming a layer stack including a granular Co-based alloy perpendicular magnetic recording layer comprised of a CoPtX alloy, where X=at least one element or material selected from the group consisting of: Cr, Ta, B, Mo, V, Nb, W, Zr, Re, Ru, Cu, Ag, Hf, Ir, Y, O, Si, Ti, N, P, Ni, $SiO_2$, SiO, $Si_3N_4$, $Al_2O_3$, AlN, TiO, $TiO_2$, $TiO_x$, TiN, TiC, $Ta_2O_5$, NiO, and CoO, and wherein Co-containing magnetic grains with hcp lattice structure are segregated by grain boundaries comprising oxides; and step (b) comprises forming the granular Co-based alloy perpendicular magnetic recording layer by reactively sputtering a target comprised of the CoPtX alloy in an atmosphere containing at least one ionized oxygen species derived from a source gas comprised of a compound of oxygen and at least one other non-metallic element, e.g., nitrogen oxides, sulfur oxides, and carbon oxides, such as NO, $NO_2$, $N_2O$, $N_2O_4$, $SO_2$, CO, and $CO_2$.

Further preferred embodiments according to the present invention include those wherein step (c) comprises generating a DC, RF, or microwave plasma containing at least one ionized oxygen species from a source gas selected from the group consisting of: nitrogen oxides, sulfur oxides, and carbon oxides, such as NO, $NO_2$, $N_2O$, $N_2O_4$, $SO_2$, CO, and $CO_2$.

Another aspect of the present invention is a method of manufacturing granular perpendicular magnetic recording media, comprising sequential steps of:

(a) providing a non-magnetic substrate including a surface;

(b) forming a layer stack on the surface of the substrate, the layer stack including a granular perpendicular magnetic recording layer having an exposed upper surface and formed by reactively sputtering a target comprised of a magnetic alloy in an atmosphere containing at least one ionized oxygen species derived from a source gas comprised of a compound of oxygen and at least one other non-metallic element; and (c) treating the exposed upper surface of the granular perpendicular magnetic recording layer with an oxygen-containing gas to form an oxidized surface layer.

According to embodiments of the present invention, step (a) comprises providing a non-magnetic substrate comprised of a non-magnetic material selected from the group consisting of: Al, NiP-plated Al, Al—Mg alloys, other Al-based alloys, other non-magnetic metals, other non-magnetic alloys, glass, ceramics, polymers, glass-ceramics, and composites and/or laminates of the aforementioned materials; and step (b) comprises forming a layer stack including a granular Co-based alloy perpendicular magnetic recording layer comprised of a CoPtX alloy, where X=at least one element or material selected from the group consisting of: Cr, Ta, B, Mo, V, Nb, W, Zr, Re, Ru, Cu, Ag, Hf, Ir, Y, O, Si, Ti, N, P, Ni $SiO_2$, SiO, $Si_3N_4$, $Al_2O_3$, AlN, TiO, $TiO_2$, $TiO_x$, TiN, TiC, $Ta_2O_5$, NiO, and CoO, and wherein Co-containing magnetic grains with hcp lattice structure are segregated by grain boundaries comprising oxides.

Preferred embodiments of the present invention include those wherein step (b) comprises forming the granular Co-based alloy perpendicular magnetic recording layer by reactively sputtering a target comprised of the CoPtX alloy in an atmosphere containing at least one ionized oxygen species derived from a source gas selected from the group consisting of: nitrogen oxides, sulfur oxides, and carbon oxides, e.g., NO, $NO_2$, $N_2O$, $N_2O_4$, $SO_2$, CO, and $CO_2$; and step (c) comprises generating a DC, RF, or microwave plasma containing at least one ionized oxygen species derived from a source gas comprised of a compound of oxygen and at least one other non-metallic element, e.g., a source gas selected from the group consisting of: nitrogen oxides, sulfur oxides, and carbon oxides, e.g., NO, $NO_2$, $N_2O$, $N_2O_4$, $SO_2$, CO, and $CO_2$, and treating the exposed upper surface of the granular perpendicular magnetic recording layer with the plasma to form the oxidized surface layer.

Yet another aspect of the present invention is a granular perpendicular magnetic recording medium, comprising:

(a) a non-magnetic substrate having a surface; and (b) a layer stack on the surface of the substrate, the layer stack including a granular perpendicular magnetic recording layer formed by:

(1) reactively sputtering a target comprised of a magnetic alloy in an atmosphere containing at least one ionized oxygen species derived from a source gas comprised of a compound of oxygen and at least one other non-metallic element; and (2) oxidizing an exposed upper surface of the granular perpendicular magnetic recording layer by generating a plasma containing at least one ionized oxygen species derived from a source gas comprised of a compound of oxygen and at least one other non-metallic element, and treating the exposed upper surface of the granular perpendicular magnetic recording layer with the plasma.

According to preferred embodiments of the present invention, the substrate is comprised of a non-magnetic material selected from the group consisting of: Al, NiP-plated Al, Al—Mg alloys, other Al-based alloys, other non-magnetic metals, other non-magnetic alloys, glass, ceramics, polymers, glass-ceramics, and composites and/or laminates of the aforementioned materials; and the layer stack includes a granular Co-based alloy perpendicular magnetic recording layer comprised of a CoPtX alloy, where X=at least one element or material selected from the group consisting of: Cr, Ta, B, Mo, V, Nb, W, Zr, Re, Ru, Cu, Ag, Hf, Ir, Y, O, Si, Ti, N, P, Ni, $SiO_2$, SiO, $Si_3N_4$, $Al_2O_3$, AlN, TiO, $TiO_2$, $TiO_x$, TiN, TiC, $Ta_2O_5$, NiO, and CoO, and wherein Co-containing magnetic grains with hcp lattice structure are segregated by grain boundaries comprising oxides.

Further preferred embodiments of the present invention include those wherein the granular Co-based alloy perpendicular magnetic recording layer is formed by reactively sputtering a target comprised of the CoPtX alloy in an atmosphere containing at least one ionized oxygen species derived from a source gas comprised of a compound of oxygen and at least one other non-metallic element, e.g., nitrogen oxides, sulfur oxides, and carbon oxides, such as NO, $NO_2$, $N_2O$, $N_2O_4$, $SO_2$, CO, and $CO_2$; and the exposed, upper surface of the magnetic recording layer is oxidized by treatment with a plasma containing at least one ionized oxygen species derived from a source gas comprised of a compound of oxygen and at least one other non-metallic element, e.g., nitrogen oxides, sulfur oxides, and carbon oxides, such as NO, $NO_2$, $N_2O$, $N_2O_4$, $SO_2$, CO, and $CO_2$.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, wherein.

DESCRIPTION OF THE INVENTION

The present invention addresses and solves problems, drawbacks, and disadvantages associated with the highly reactive nature of $O_2$ gas conventionally utilized in the manufacture of granular-type perpendicular magnetic recording media. Specifically, the present invention addresses and solves problems which occur when performing reactive sputter deposition of granular perpendicular magnetic recording layers in an atmosphere containing $O_2$ gas, and when performing post-deposition oxidation treatment of such layers in the ambient, i.e., $O_2$-containing, atmosphere or in dedicated oxidation chambers or stations supplied with $O_2$ gas. Disadvantages and drawbacks associated with the use of $O_2$-containing gas in such applications include difficulty in controlling the amount of oxide which is formed surrounding each of the magnetic grains of the recording layer, and difficulty in obtaining uniform products in large-scale manufacture utilizing multi-chamber apparatus. In addition, the highly reactive nature of the $O_2$ or $O_2$-containing gas requires that each treatment chamber or station of the multi-chamber manufacturing apparatus be very completely isolated from other treatment chambers or stations in order to prevent contamination of those treatment chambers or stations from which oxygen must be excluded, which complete isolation is extremely difficult to achieve in practice.

According to advantageous features of the inventive methodology, deleterious effects arising from the presence of highly reactive $O_2$ gas in the reactive sputter deposition and post-deposition oxidation treatment chambers are effectively minimized or eliminated by generating reactive, ionized oxygen-containing species in situ, whereby the reactive species are formed within the respective process chambers or stations at the time of reaction and rapidly consumed therein by the reaction. As a consequence, the amount of oxide formed surrounding the magnetic grains during the reactive sputtering is readily controlled at a desired amount, and contamination of other oxygen-free process chambers or stations with $O_2$ gas is minimized or entirely prevented.

Figure 2:
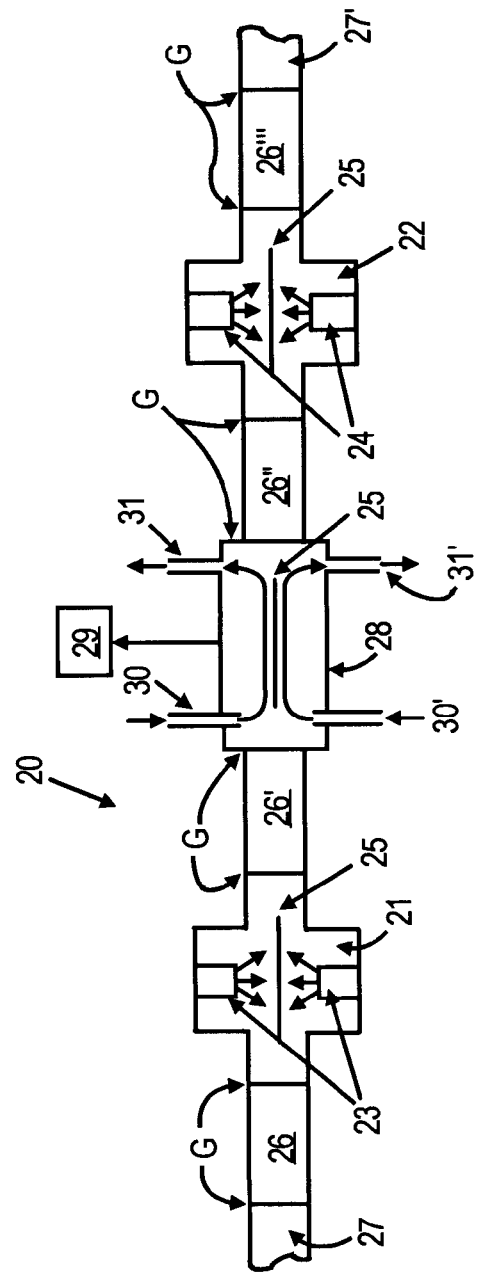
FIG. 2 schematically illustrates, in simplified plan view, a portion of an in-line apparatus for continuous manufacture of granular perpendicular magnetic recording media according to the present invention.

The principles of the present method will now be described in detail by reference to FIG. 2, which schematically illustrates, in simplified plan view, a portion of a non-limitative example of an in-line apparatus 20 suitable for continuous manufacture of granular perpendicular magnetic recording media according to an embodiment of the present invention. As illustrated, apparatus 20 comprises a series of linearly arranged process chambers interconnected by respective buffer/isolation chambers 26, etc., each equipped with gate means G. Specifically, apparatus 20 includes first and second spaced-apart thin film deposition chambers or stations 21 and 22, illustratively, sputter deposition chambers or stations, each including at least one, preferably a pair of spaced-apart, facing sputter sources 23 or 24, for performing deposition of a thin film on at least one surface of substrates 25, preferably simultaneous thin film deposition on both sides of dual-sided substrates 25. Apparatus 20 further comprises pairs of buffer/isolation chambers, such as 26, 26' and 26", 26''', at laterally spaced opposite ends of respective deposition chambers or stations 21 and 22 for insertion and withdrawal, respectively, of a plurality of substrates 25, e.g., disk-shaped substrates for hard disk recording media carried and transported through each station and from chamber-to-chamber by means of a corresponding plurality of substrate mounting/transport means (not shown in the figure for illustrative simplicity).

In operation of apparatus 20, each of the opposing surfaces of the dual-surfaced substrates 25 faces a respective sputter source 23 or 24 during "pass-by" transport and treatment/processing in the apparatus. Chambers 27, 27' connected to the distal ends of inlet and outlet buffer/isolation chambers 26 and 26''', respectively, are provided for utilizing apparatus 20 as part of a larger, continuously operating, in-line apparatus wherein the substrates 25 receive deposition or other treatment antecedent and/or subsequent to processing in the apparatus portion illustrated in FIG. 2.

A third station or chamber 28, i.e., a plasma oxidation chamber, is positioned intermediate the first and second spaced-apart sputter deposition chambers or stations 21 and 22 and operatively connected thereto by means of buffer/isolation chambers 26' and 26" (and associated gate means G) at the respective inlet and outlet ends thereof. As illustrated, chamber 28 is adapted for performing a plasma treatment for oxidizing the oppositely facing surfaces of dual-sided substrates 25, and includes opposing pairs of gas inlets 30, 30' and outlets 31, 31' for flowing an ionized oxygen-containing source gas past the opposing surfaces of substrates 25. Chamber 28 further comprises at least one plasma source means 29 of conventional type, adapted for generating a plasma comprising ionized oxygen from the oxygen-containing source gas supplied to chamber 28 via inlets 30, 30', which at least one plasma source means 29 is selected from the group consisting of inductively or capacitively coupled DC or RF sources, and microwave sources.

Figure 1:
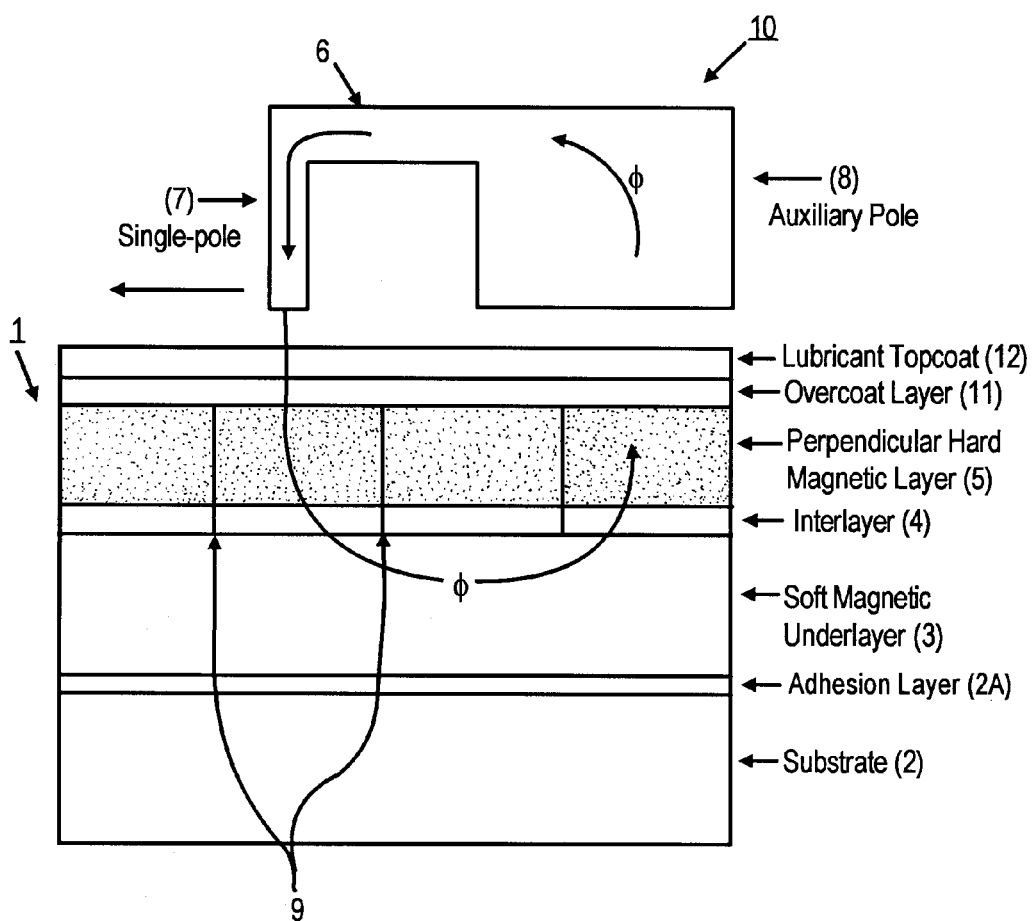
FIG. 1 schematically illustrates, in simplified cross-sectional view, a portion of a magnetic recording storage, and retrieval system comprised of a perpendicular magnetic recording medium and a single pole transducer head.

In operation of apparatus 20 according to the present invention, precursor substrates 25, typically dual-sided, annular disk-shaped substrates for hard disk magnetic recording media (such as substrate 2 of FIG. 1, described in detail supra, and typically comprised of a non-magnetic material selected from the group consisting of: Al, NiP-plated Al, Al—Mg alloys, other Al-based alloys, other non-magnetic metals, other non-magnetic alloys, glass, ceramics, polymers, glass-ceramics, and composites and/or laminates of the aforementioned materials), enter the illustrated portion of apparatus 20 at inlet chamber 27 after receiving antecedent processing in a plurality of downstream processing chambers or stations (not shown in the drawing for illustrative simplicity), for deposition of an adhesion layer, a soft magnetic underlayer, and at least one non-magnetic interlayer (corresponding to the layers respectively identified by reference numerals 2A, 3, and 4 in FIG. 1 and described in detail supra), typically on both surfaces thereof.

The precursor substrates 25 supplied to inlet chamber 27 are transported to the first sputter deposition chamber or station 21, wherein a granular perpendicular hard magnetic recording layer (corresponding to layer 5 in FIG. 1), such as, for example, a granular Co-based alloy perpendicular magnetic recording layer comprised of a CoPtX alloy, where X=at least one element or material selected from the group consisting of: Cr, Ta, B, Mo, V, Nb, W, Zr, Re, Ru, Cu, Ag, Hf, Ir, Y, O, Si, Ti, N, P, Ni, $SiO_2$, SiO, $Si_3N_4$, $Al_2O_3$, AlN, $TiO_2$, $TiO_2$, $TiO_x$, TiN, TiC, $Ta_2O_5$, NiO, and CoO, and wherein Co-containing magnetic grains with hcp lattice structure are segregated by grain boundaries comprising oxides, is formed on the non-magnetic interlayer(s) 4 by a reactive sputter deposition process performed according to the present invention, i.e., where a target comprised of a magnetic alloy, e.g., a CoPtX alloy (as described supra) is reactively sputtered (typically DC sputtered) in an atmosphere containing at least one ionized oxygen species derived from a source gas comprised of a compound of oxygen and at least one other non-metallic element, e.g., nitrogen oxides, sulfur oxides, and carbon oxides, such as NO, $NO_2$, $N_2O$, $N_2O_4$, $SO_2$, CO, and $CO_2$. Typically, the source gas is supplied to chamber 21 admixed (at from about 0.1 to about 50 vol. %, preferably about 5 vol. %) with an inert sputtering gas, e.g., Ar, and at a total pressure from about 1 to about 100 mTorr, preferably about 30 mTorr.

Following deposition of a selected granular perpendicular hard magnetic recording layer 5 of appropriate thickness on the surface(s) of the precursor substrates 25 in the first sputter deposition chamber or station 21, the substrates are transported, via buffer/isolation chamber 26' and associated gates G, to chamber 28 for performing plasma oxidation of the surface of the perpendicular hard magnetic recording layer(s) 5. According to the invention, a DC, RF, or microwave generated plasma comprising at least one ionized oxygen species, derived from a source gas comprised of a compound of oxygen and at least one other non-metallic element, e.g., nitrogen oxides, sulfur oxides, and carbon oxides, such as NO, $NO_2$, $N_2O$, $N_2O_4$, $SO_2$, CO, and $CO_2$, alone or in admixture with at least one inert gas, e.g., Ar, is flowed past the surface(s) of the substrates/workpieces 25 via inlet conduits 30, 30' and outlet conduits 31, 31' located on opposite side walls of chamber 28. Typical pressures within plasma treatment chamber 28, whether the source gas is supplied to chamber 28 alone or in admixture with the at least one inert gas, range from about 1 to about 100 mTorr, preferably about 30 mTorr. The flow rates of the plasma gas range from about 5 to about 100 sccm, preferably about 30 sccm, and the power density supplied by plasma generating source 29 typically ranges from about 10 $mW/cm^2$ to about 100 $W/cm^2$, preferably about 1 $W/cm^2$. The combination of plasma gas pressure and flow rate, and plasma generating power supplied to chamber 28 is selected for formation of a suitably thick (or complete) surface oxide layer, e.g., from about 2 to about 100 Å thick, preferably about 10 Å thick, at a suitable continuous transport rate of the substrates/workpieces 25 through chamber 28.

Following formation of the surface oxide layer(s) on the magnetic recording layer(s) in chamber 28, the substrates 25 are transported, via buffer/isolation chamber 26" and associated gates G, to the second sputter deposition chamber or station 22, where a protective overcoat layer (corresponding to the layer identified by reference numeral 11 in FIG. 1 and described in detail supra) is formed over the plasma-oxidized perpendicular hard magnetic recording layer(s) 5, as by sputtering of a carbon (C)-based layer, e.g., diamond-like carbon (DLC). The thus-processed substrates 25 are then transported, via outlet buffer/isolation chamber 26''' and associated gates G, to chamber 27', for further processing within apparatus 20 or for withdrawal therefrom apparatus 20 for further processing, e.g., for deposition thereon of a lubricant topcoat layer (corresponding to the layer identified by reference numeral 12 in FIG. 1 and described in detail supra), e.g., deposition of a perfluoropolyether compound by means of dipping or vapor deposition.

According to advantageous features of the inventive methodology, deleterious effects arising from the presence of highly reactive $O_2$ gas in the reactive sputter deposition and post-deposition oxidation treatment chambers are effectively minimized or eliminated by generating reactive, ionized oxygen-containing species in situ, whereby the reactive species are formed within the process chambers or stations at the time of reaction and rapidly consumed therein. As a consequence, the amount of oxide formed surrounding the magnetic grains during the reactive sputtering is readily controlled at a desired amount, and contamination of other oxygen-free process chambers or stations with $O_2$ gas is minimized or entirely prevented.

In summary, the present invention provides improved methodology for fabrication of high areal density, high performance granular perpendicular magnetic recording media, including formation of the granular perpendicular magnetic recording layer by means of reactive sputter deposition, and formation of a surface oxide layer on the perpendicular hard magnetic recording layer by means of plasma oxidation, while maintaining full compatibility with all aspects of automated manufacturing technology. The present invention advantageously minimizes or eliminates the disadvantages and drawbacks associated with prior methodologies utilizing oxygen ($O_2$) gas for performing the reactive sputter deposition and post-deposition surface oxidation processing. Specifically, deleterious effects arising from the presence of highly reactive $O_2$ gas in the reactive sputter deposition and post-deposition oxidation treatment chambers resulting in, inter alia, poor product uniformity and cross-contamination of process chambers, are effectively minimized or eliminated by generating reactive, ionized oxygen-containing species in situ, whereby the reactive species are formed within the process chambers or stations at the time of reaction and rapidly consumed therein.

Finally, the inventive methodologies can be utilized with many types of magnetic recording media, regardless of the materials used for the substrate, adhesion layer, soft magnetic underlayer(s), interlayer(s), and recording layer(s). The process parameters and duration are preferably optimized according to the media design and the particular manufacturing apparatus in order to obtain the maximum benefit of the inventive methodologies.

In the previous description, numerous specific details are set forth, such as specific materials, structures, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present disclosure. It is to be understood that the present invention is capable of use in various other combinations and environments and is susceptible of changes and/or modifications within the scope of the inventive concept as expressed herein.

What is claimed is:

1. A method of manufacturing granular perpendicular magnetic recording media, comprising sequential steps of:
   (a) providing a non-magnetic substrate including a surface;
   (b) forming a layer stack on said surface of said substrate, said layer stack including a granular perpendicular magnetic recording layer having an exposed upper surface;
   (c) generating a plasma containing at least one ionized oxygen species derived from a source gas comprised of a compound of oxygen and at least one other non-metallic element; and
   (d) treating said exposed upper surface of said granular perpendicular magnetic recording layer with said plasma to form an oxidized surface layer.

2. The method according to claim 1, wherein:
step (a) comprises providing a non-magnetic substrate comprised of a non-magnetic material selected from the group consisting: of Al, NiP-plated Al, Al—Mg alloys, Al-based alloys, non-magnetic metals, non-magnetic alloys, glass, ceramics, polymers, glass-ceramics, and composites and/or laminates of the aforementioned materials.

3. The method according to claim 1, wherein:
step (b) comprises forming a layer stack including a granular Co-based alloy perpendicular magnetic recording layer comprised of a CoPtX alloy, where X=at least one element or material selected from the group consisting of: Cr, Ta, B, Mo, V, Nb, W, Zr, Re, Ru, Cu, Ag, Hf, Ir, Y, O, Si, Ti, N, P, Ni, $SiO_2$, SiO, $Si_3N_4$, $Al_2O_3$, AlN, TiO, $TiO_2$, $TiO_x$, TiN, TiC, $Ta_2O_5$, NiO, and CoO, and wherein Co-containing magnetic grains with hcp lattice structure are segregated by grain boundaries comprising at least one of oxides, nitrides, and carbides.

4. The method according to claim 1, wherein:
step (b) comprises forming a layer stack including a granular Co-based alloy perpendicular magnetic recording layer comprised of a CoPtX alloy, where X=at least one element or material selected from the group consisting of: Cr, Ta, B, Mo, V, Nb, W, Zr, Re, Ru, Cu, Ag, Hf, Ir, Y, O, Si, Ti, N, P, Ni, $SiO_2$, SiO, $Si_3N_4$, $Al_2O_3$, AlN, TiO, $TiO_2$, $TiO_x$, TiN, TiC, $Ta_2O_5$, NiO, and CoO, and wherein Co-containing magnetic grains with hcp lattice structure are segregated by grain boundaries comprising oxides.

5. The method according to claim 4, wherein:
step (b) comprises forming said granular Co-based alloy perpendicular magnetic recording layer by reactively sputtering a target comprised of said CoPtX alloy in an atmosphere containing at least one ionized oxygen species derived from a source gas comprised of a compound of oxygen and at least one other non-metallic element.

6. The method according to claim 5, wherein:
step (b) comprises forming said granular Co-based alloy perpendicular magnetic recording layer by reactively sputtering a target comprised of said CoPtX alloy in an atmosphere containing at least one ionized oxygen species derived from a source gas selected from the group consisting of: nitrogen oxides, sulfur oxides, and carbon oxides.

7. The method according to claim 6, wherein:
step (b) comprises forming said granular Co-based alloy perpendicular magnetic recording layer by reactively sputtering a target comprised of said CoPtX alloy in an atmosphere containing at least one ionized oxygen species derived from a source gas selected from the group consisting of: NO, $NO_2$, $N_2O$, $N_2O_4$, $SO_2$, CO, and $CO_2$.

8. The method according to claim 1, wherein:
step (c) comprises generating said plasma containing at least one ionized oxygen species from a source gas selected from the group consisting of: nitrogen oxides, sulfur oxides, and carbon oxides.

9. The method according to claim 8, wherein:
step (c) comprises generating said plasma containing at least one ionized oxygen species from a source gas selected from the group consisting of: NO, $NO_2$, $N_2O$, $N_2O_4$, $SO_2$, CO, and $CO_2$.

10. The method according to claim 8, wherein:
step (c) comprises generating a DC, RF, or microwave plasma.

11. A method of manufacturing granular perpendicular magnetic recording media, comprising sequential steps of:
   (a) providing a non-magnetic substrate including a surface;
   (b) forming a layer stack on said surface of said substrate, said layer stack including a granular perpendicular magnetic recording layer having an exposed upper surface and formed by reactively sputtering a target comprised of a magnetic alloy in an atmosphere containing at least one ionized oxygen species derived from a source gas comprised of a compound of oxygen and at least one other non-metallic element; and
   (c) treating said exposed upper surface of said granular perpendicular magnetic recording layer with an oxygen-containing gas to form an oxidized surface layer.

12. The method according to claim 11, wherein:
step (a) comprises providing a non-magnetic substrate comprised of a non-magnetic material selected from the group consisting: of Al, NiP-plated Al, Al—Mg alloys, other Al-based alloys, other non-magnetic metals, other 13. The method according to claim 11, wherein:
step (b) comprises forming a layer stack including a granular Co-based alloy perpendicular magnetic recording layer comprised of a CoPtX alloy, where X=at least one element or material selected from the group consisting of: Cr, Ta, B, Mo, V, Nb, W, Zr, Re, Ru, Cu, Ag, Hf, Ir, Y, O, Si, Ti, N, P, Ni, $SiO_2$, SiO, $Si_3N_4$, $Al_2O_3$, AlN, TiO, $TiO_2$, $TiO_x$, TiN, TiC, $Ta_2O_5$, NiO, and CoO, and wherein Co-containing magnetic grains with hcp lattice structure are segregated by grain boundaries comprising oxides.

14. The method according to claim 13, wherein:
step (b) comprises forming said granular Co-based alloy perpendicular magnetic recording layer by reactively sputtering a target comprised of said CoPtX alloy in an atmosphere containing at least one ionized oxygen species derived from a source gas selected from the group consisting of: nitrogen oxides, sulfur oxides, and carbon oxides.

15. The method according to claim 14, wherein: step (b) comprises forming said granular Co-based alloy perpendicular magnetic recording layer by reactively sputtering a target comprised of said CoPtX alloy in an atmosphere containing at least one ionized oxygen species derived from a source gas selected from the group consisting of: NO, $NO_2$, $N_2O$, $N_2O_4$, $SO_2$, CO, and $CO_2$.

16. The method according to claim 11, wherein:
step (c) comprises generating a plasma containing at least one ionized oxygen species derived from a source gas comprised of a compound of oxygen and at least one other non-metallic element, and treating said exposed upper surface of said granular perpendicular magnetic recording layer with said plasma to form said oxidized surface layer.

17. The method according to claim 16, wherein:
step (c) comprises generating said plasma containing at least one ionized oxygen species from a source gas selected from the group consisting of: nitrogen oxides, sulfur oxides, and carbon oxides.

18. The method according to claim 17, wherein:
step (c) comprises generating said plasma containing at least one ionized oxygen species from a source gas selected from the group consisting of: NO, $NO_2$, $N_2O$, $N_2O_4$, $SO_2$, CO, and $CO_2$.

19. The method according to claim 16, wherein:
step (c) comprises generating a DC, RF, or microwave plasma.

* * * * *